(12) United States Patent
Tomita et al.

(10) Patent No.: US 11,677,225 B2
(45) Date of Patent: Jun. 13, 2023

(54) ELECTRIC JUNCTION BOX AND ASSEMBLING METHOD THEREOF

(71) Applicant: Yazaki Corporation, Tokyo (JP)

(72) Inventors: Kei Tomita, Makinohara (JP); Kengo Ishida, Makinohara (JP); Yukihiro Koyama, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 17/494,548

(22) Filed: Oct. 5, 2021

(65) Prior Publication Data

US 2022/0115853 A1 Apr. 14, 2022

(30) Foreign Application Priority Data

Oct. 12, 2020 (JP) .............................. JP2020-172004

(51) Int. Cl.
  *B60R 16/023* (2006.01)
  *H05K 5/00* (2006.01)
  *H02G 3/14* (2006.01)
  *H02G 3/18* (2006.01)

(52) U.S. Cl.
  CPC ........... *H02G 3/14* (2013.01); *B60R 16/0239* (2013.01); *H02G 3/18* (2013.01); *H05K 5/0026* (2013.01)

(58) Field of Classification Search
  CPC .......................... B60R 16/0239; H05K 5/0026
  See application file for complete search history.

(56) References Cited

U.S. PATENT DOCUMENTS

| | | | |
|---|---|---|---|
| 9,787,074 B1* | 10/2017 | Matsumura | H02G 3/16 |
| 10,027,100 B1* | 7/2018 | Nakano | H02G 3/083 |
| 2009/0242267 A1* | 10/2009 | Nakayama | H05K 5/0073 |
| | | | 174/520 |
| 2015/0305184 A1 | 10/2015 | Tokumasu et al. | |
| 2017/0098523 A1* | 4/2017 | Schwartz | B60R 16/0238 |
| 2018/0263128 A1* | 9/2018 | Nakano | H02G 3/081 |
| 2019/0283694 A1* | 9/2019 | Chaen | H02G 3/14 |
| 2020/0176961 A1* | 6/2020 | Tomita | H01B 7/0045 |
| 2021/0143620 A1* | 5/2021 | Sugiyama | H02G 3/14 |
| 2021/0175697 A1* | 6/2021 | Tashiro | H02G 3/083 |
| 2022/0111808 A1* | 4/2022 | Tomita | H02G 3/16 |
| 2022/0115855 A1* | 4/2022 | Tomita | B60R 16/0238 |

FOREIGN PATENT DOCUMENTS

JP  2008-54371 A  3/2008
JP  2015-208123 A  11/2015

* cited by examiner

*Primary Examiner* — Hung V Ngo
(74) *Attorney, Agent, or Firm* — Sughrue Mion, PLLC

(57) ABSTRACT

In an electric junction box, both first locking portions and second locking portions are provided in one accommodation portion. The first locking portions are capable of locking an FL holder when the FL holder is inserted from an upper opening toward a lower opening. The second locking portions are capable of locking an FL holder when the FL holder is inserted from the lower opening toward the upper opening. Accordingly, the FL holders can be inserted into the same accommodation portion from the upper opening and the lower opening.

6 Claims, 8 Drawing Sheets

ELECTRIC JUNCTION BOX AND ASSEMBLING METHOD THEREOF

CROSS-REFERENCE TO RELATED APPLICATIONS

This application is based on and claims priority under 35 USC 119 from Japanese Patent Application No. 2020-172004 filed on Oct. 12, 2020, the contents of which are incorporated herein by reference.

TECHNICAL FIELD

The present invention relates to an electric junction box and an assembling method thereof.

BACKGROUND ART

In the related art, an electric junction box (for example, a relay box) mounted on a vehicle has been known. The electric junction box accommodates a holding portion such as an FL holder that holds a fuse (electronic component) (Patent Literature 1).

The FL holder is accommodated in a case of the electric junction box. The case includes a tubular frame with an upper opening and a lower opening at both end portions in an up-down direction, an upper cover that covers the upper opening, and a lower cover that covers the lower opening. The inside of the frame is divided into a plurality of tubular accommodation portions. The FL holder is accommodated and locked in the accommodation portion.

CITATION LIST

Patent Literature

Patent Literature 1: JP-2008-54371-A

A timing of accommodating the FL holder may change depending on the specification of the vehicle. For example, in the case of accommodating the FL holder before the delivery of the electric junction box, the FL holder is inserted from the lower opening and accommodated in the accommodation portion. In the case of accommodating the FL holder after attaching the electric junction box to the vehicle, the lower cover cannot be removed from the frame. In this case, the FL holder is inserted through the upper opening and accommodated in the accommodation portion.

Therefore, it is necessary to prepare a frame including an accommodation portion that can be locked by inserting the FL holder from above and a frame having an accommodation portion that can be locked by inserting the FL holder from below, which cases a problem in cost.

SUMMARY OF INVENTION

The present invention has been made in view of the above circumstances, and an object thereof is to provide an electric junction box and an assembling method thereof, which achieve cost reduction.

An electric junction box according to the present invention including:
a holding portion configured to hold an electronic component; and
a case configured to accommodate the holding portion, and including a tubular frame with a first opening and a second opening at both end portions, a first cover that closes the first opening, and a second cover that closes the second opening.

The frame includes a tubular frame main body and a tubular accommodation portion for accommodating the holding portion, which is provided by partitioning an inside of the frame main body, and
both a first locking portion, capable of locking the holding portion when the holding portion is inserted from the first opening toward the second opening, and a second locking portion, capable of locking the holding portion when the holding portion is inserted from the second opening toward the first opening, are provided in one accommodation portion.

An assembling method of an electric junction box according to the present invention, the assembling method including:
a locking step of accommodating the holding portion in the accommodation portion through the first opening, locking the holding portion to the accommodation portion, and arranging the electric wire connected to the electronic component in the first notch; and
a first cover attachment step of attaching the first cover after the locking step.

The present invention has been briefly described above. Further, details of the present invention will be clarified by reading a mode (hereinafter, referred to as an "embodiment") for carrying out the invention to be described below with reference to the accompanying drawings.

DESCRIPTION OF EMBODIMENTS

A specific embodiment according to the present invention will be described below with reference to the drawings.

An electric junction box of the present embodiment is typically mounted on a vehicle and accommodates electronic components such as a relay and a fuse.

Figure 1:
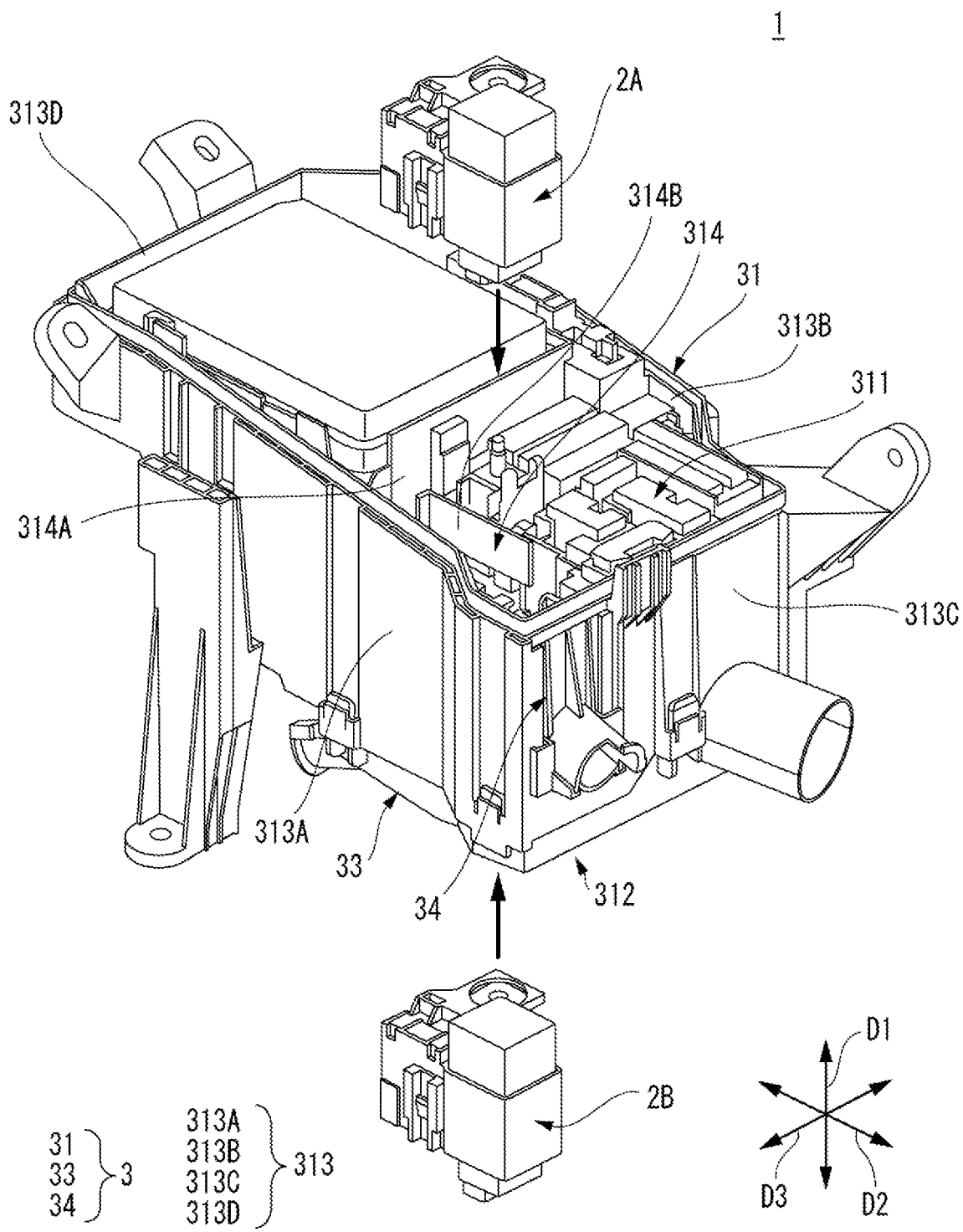
FIG. 1 is an exploded perspective view showing an electric junction box of the present invention.
Figure 2:
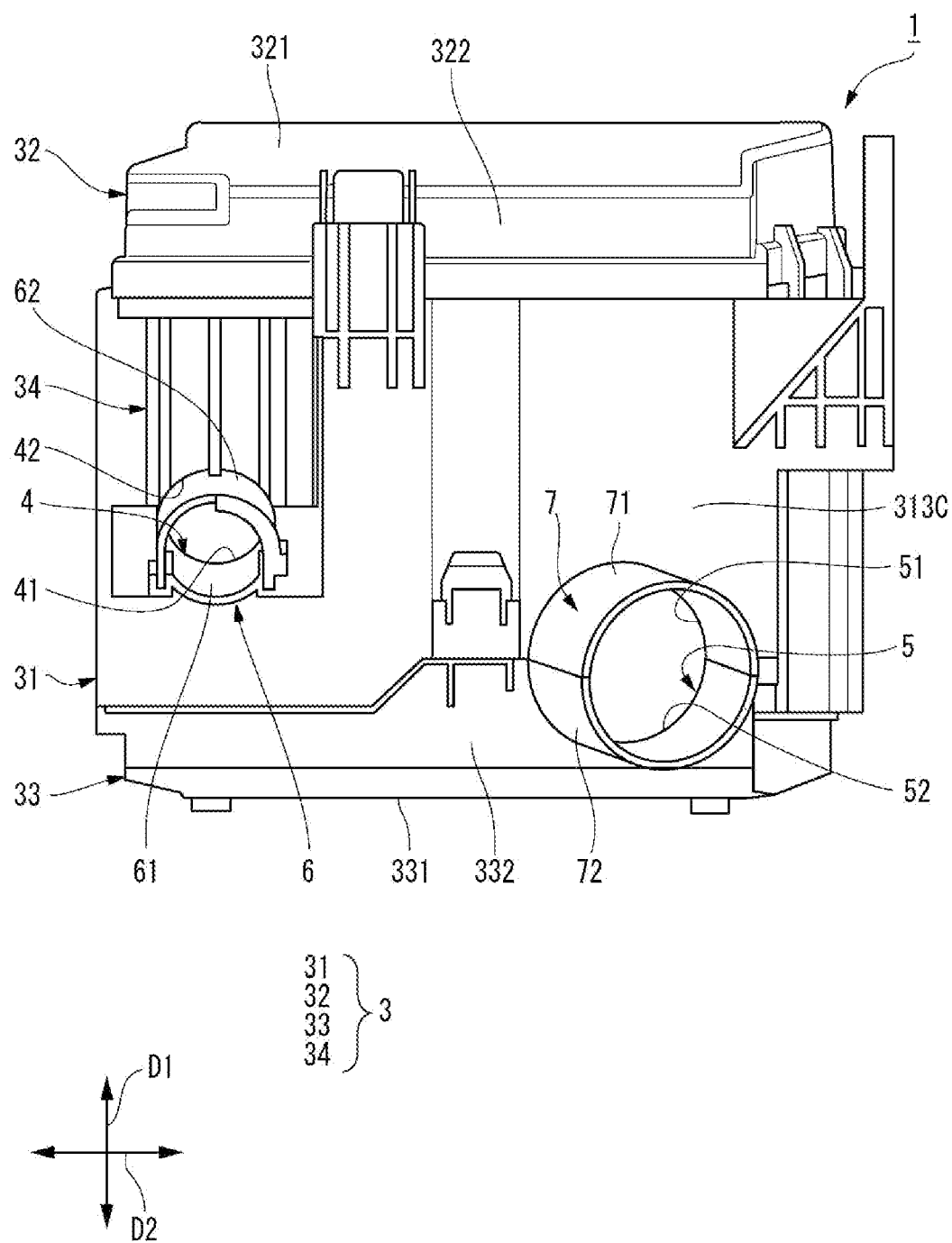
FIG. 2 is a side view of the electric junction box shown in FIG. 1.

As shown in FIG. 1, an electric junction box 1 includes an FL holder 2A or 2B (holding portion), a case 3 for accommodating one of the FL holder 2A or 2B, a first electric wire through hole 4 (see FIG. 2) for pulling out an electric wire (not shown) from the case 3, and a second electric wire through hole 5 (see FIG. 2).

Hereinafter, for convenience of explanation, as shown in FIG. 1 or the like, an "up-down direction D1", a "longitudinal direction D2", and a "lateral direction D3" are defined. The "up-down direction D1", the "longitudinal direction D2", and the "lateral direction D3" are orthogonal to one another. When the electric junction box 1 is mounted on the vehicle, the "up-down direction D1" corresponds to the up-down direction of the vehicle. In addition, the case 3 is provided in a substantially rectangular shape when viewed from above. The "longitudinal direction D2" corresponds to the longitudinal direction of the rectangular case 3. The "lateral direction D3" corresponds to the lateral direction of the rectangular case 3.

Figure 3:
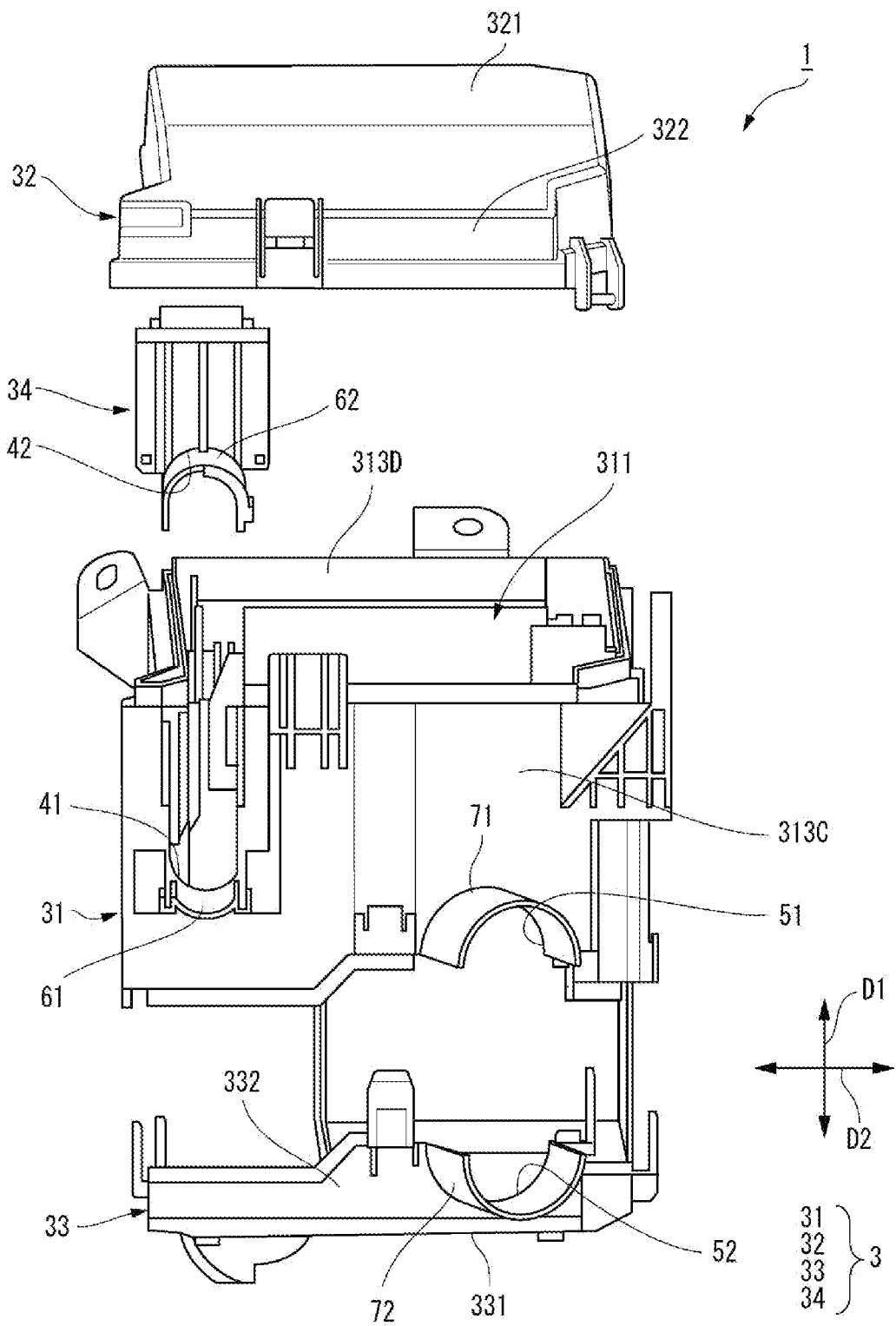
FIG. 3 is an exploded side view of the electric junction box shown in FIG. 1.

A fuse H (electronic component) is held in the FL holder 2A or 2B. In the present embodiment, two types of FL holders 2A or 2B are prepared, and one of the two types of FL holders 2A or 2B is accommodated in the case 3. Next, the case 3 will be described before the details of the FL holder 2A or 2B are described. As shown in FIG. 3, the case 3 includes a tubular frame 31 with an upper opening (first opening) 311 and a lower opening (second opening) 312 at both end portions in the up-down direction D1, an upper cover (first cover) 32 that closes the upper opening 311, a lower cover (second cover) 33 that closes the lower opening 312, and a side cover (third cover) 34 that covers the frame 31.

As shown in FIG. 1, the frame 31 includes a tubular frame main body 313, and a tubular accommodation portion 314 for accommodating the FL holder 2A or 2B, which is provided by partitioning an inside of the frame main body 313. The frame main body 313 includes peripheral walls 313A to 313D and is formed in a square tubular shape. In addition, the frame 31 is provided with partition walls 314A and 314B that partition the inside of the frame main body 313. The peripheral walls 313A and 313C and the partition walls 314A and 314B form a substantially square tubular accommodation portion 314.

More specifically, the peripheral walls 313A and 313B are provided to be orthogonal to the lateral direction D3 and separated from each other in the lateral direction D3. The peripheral walls 313C and 313D are provided orthogonal to the longitudinal direction D2 and separated from each other in the longitudinal direction D2. Both end portions of the peripheral wall 313C in the lateral direction D3 are provided to be connected to one end portions of the peripheral walls 313A and 313B in the longitudinal direction D2. Both end portions of the peripheral wall 313D in the lateral direction D3 are provided to be connected to the other end portions of the peripheral walls 313A and 313B in the longitudinal direction D2.

The partition wall 314A is orthogonal to the longitudinal direction D2 and is arranged to be separated from the peripheral wall 313C in the longitudinal direction D2. The partition wall 314B is orthogonal to the lateral direction D3 and is arranged to be separated from the peripheral wall 313A in the lateral direction D3. One end portion of the partition wall 314B in the longitudinal direction D2 is connected to the peripheral wall 313C, and the other end portion of the partition wall 314B in the longitudinal direction D2 is connected to the partition wall 314A. The peripheral walls 313A and 313C and the partition walls 314A and 314B form the accommodation portion 314.

Figure 4:
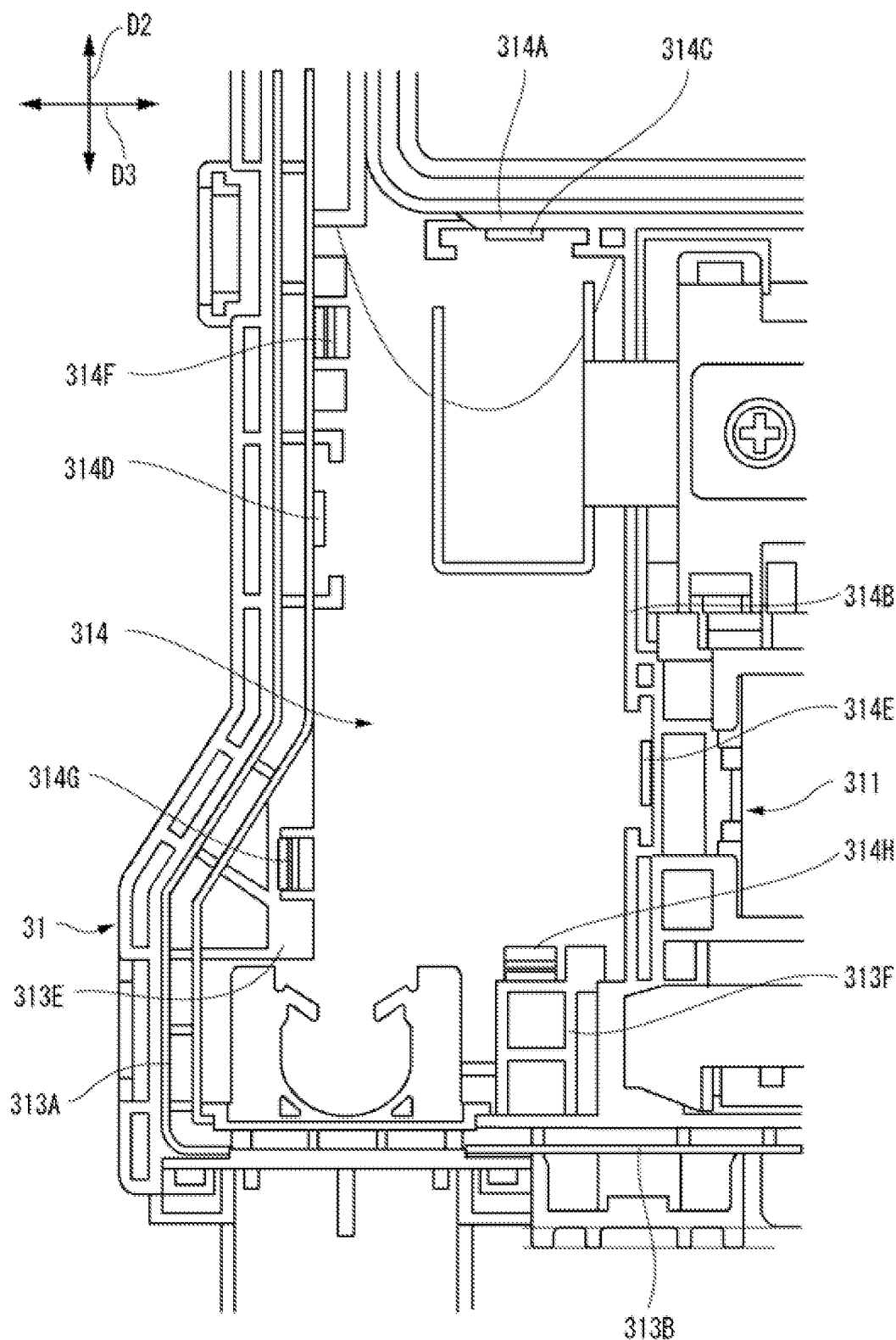
FIG. 4 is a partial top view of a frame shown in FIG. 1.
Figure 7:
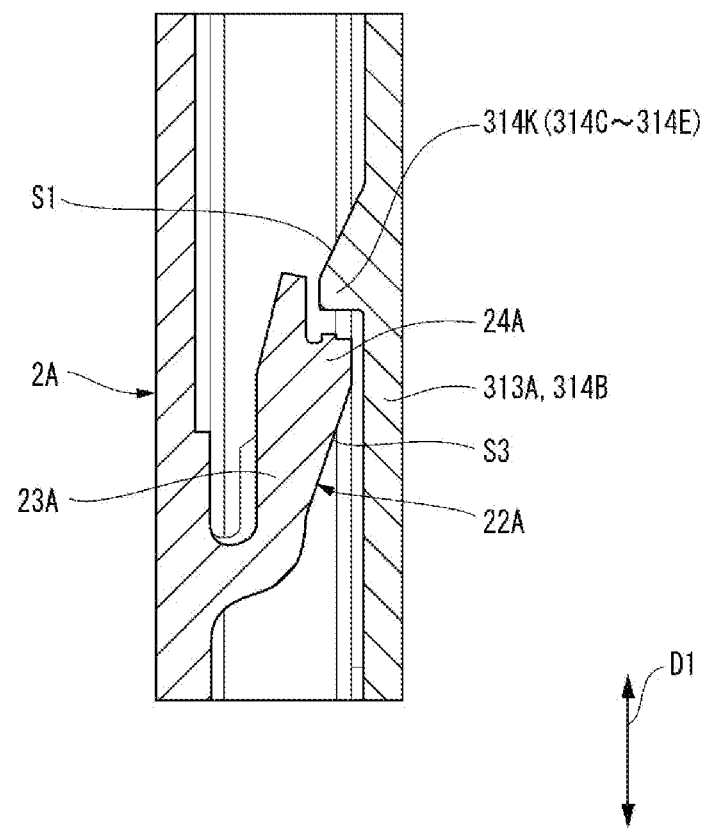
FIG. 7 is a partial cross-sectional view of FIG. 5.

As shown in FIG. 4, both first locking portions 314C to 314E, capable of locking the FL holder 2A when the FL holder 2A is inserted from the upper opening 311 toward the lower opening 312 (lower side in the up-down direction D1), and second locking portions 314F to 314H, capable of locking the FL holder 2B when the FL holder 2B is inserted from the lower opening 312 toward the upper opening 311 (upper side in the up-down direction D1), are provided in the accommodation portion 314. In the present embodiment, the first locking portions 314C to 314E are provided on the partition wall 314A, the peripheral wall 313A, and the partition wall 314B, respectively. The first locking portions 314D and 314E provided on the peripheral wall 313A and the partition wall 314B are provided at positions displaced in the longitudinal direction D2. As shown in FIG. 7, the first locking portions 314C to 314E each include a locking protrusion 314K having an inclined surface S1 whose protrusion amount increases toward the lower side in the up-down direction D1.

Figure 8:
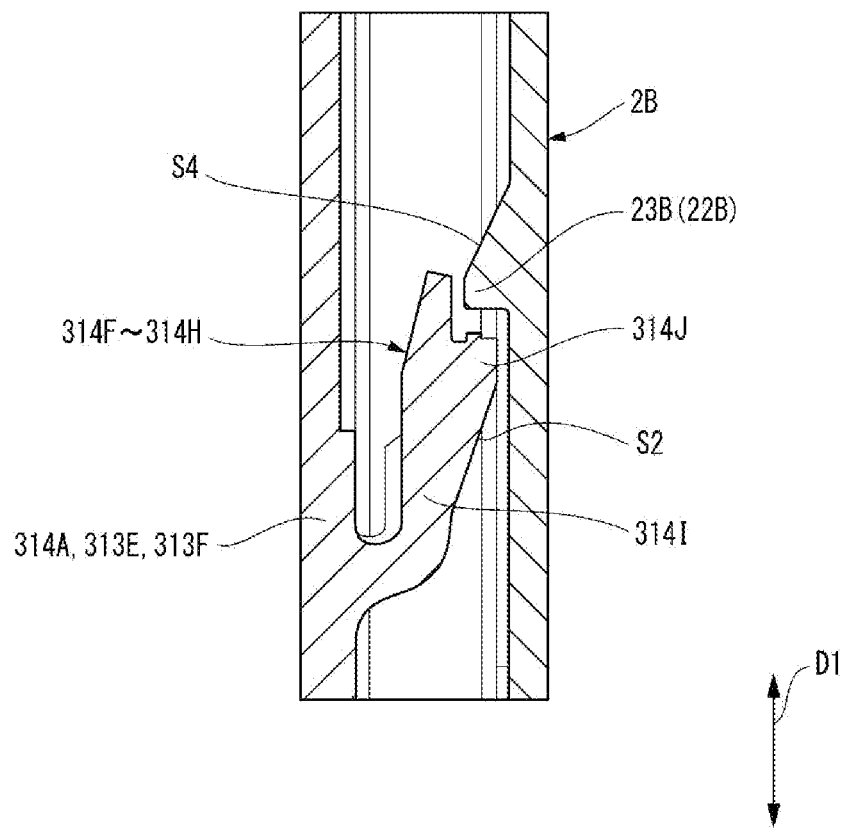
FIG. 8 is a partial cross-sectional view of FIG. 6.

In the present embodiment, as shown in FIG. 4, the second locking portion 314F is provided on the peripheral wall 313A. The second locking portion 314G is provided on a support portion 313E protruding inward from the peripheral wall 313A. The first locking portion 314D is provided between the second locking portion 314F and the second locking portion 314G. In addition, the second locking portion 314H is provided on a support portion 313F protruding inward from the peripheral wall 313B. As shown in FIG. 8, the second locking portions 314F to 314H are each provided with a locking arm 3141 that protrudes upward from the peripheral wall 313A and the support portions 313E and 313F, and whose upper end bends in a direction of contacting with and separating from the peripheral wall 313A and the support portions 313E and 313F, and a locking protrusion 314J that is provided slightly below an upper end of the locking arm 3141. The locking protrusion 314J is provided with an inclined surface S2 whose protrusion amount increases toward the upper side in the up-down direction D1.

Figure 5:
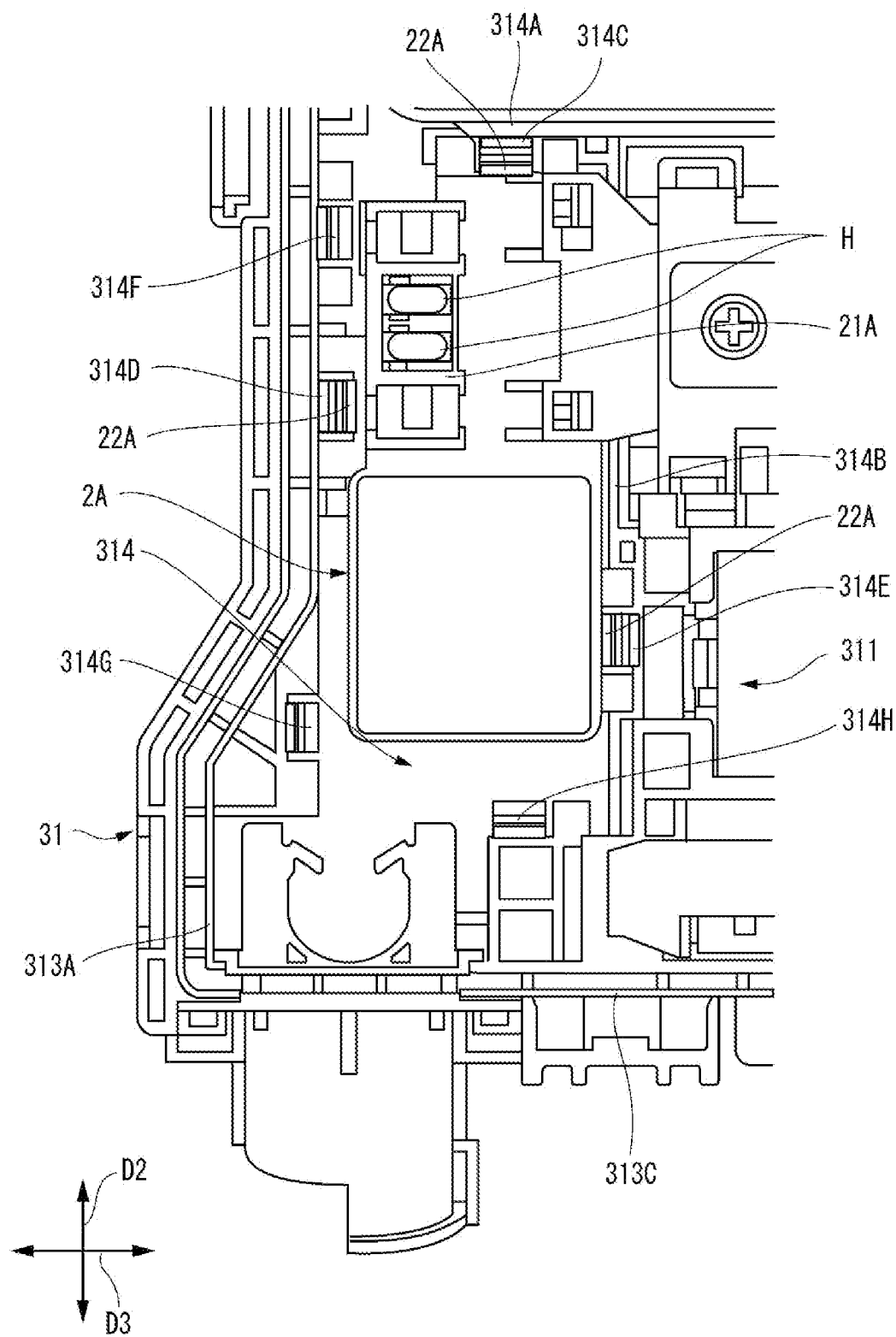
FIG. 5 is a partial top view when an FL holder 2A is accommodated in the frame shown in FIG. 4.

Next, before explaining the upper cover 32, the lower cover 33, and the side cover 34, the FL holder 2A will be described. As shown in FIG. 5, the FL holder 2A is provided with a mounting portion 21A for mounting the fuse H on the upper side in the up-down direction D1. In addition, the FL holder 2A includes a third locking portion 22A configured to be locked to the first locking portions 314C to 314E on the outer surface thereof. As shown in FIG. 7, the third locking portion 22A is provided with a locking arm 23A that protrudes upward from the outer side surface and bends in the direction in which the upper end comes into contact with and separates from the outer surface, and a locking protrusion 24A that is provided slightly below an upper end of the locking arm 23A. The locking protrusion 24A is provided with an inclined surface S3 whose protrusion amount increases toward the upper side in the up-down direction D1.

With the above configuration, when the FL holder 2A is inserted from the upper opening 311 toward the lower opening 312, the locking protrusions 314K and 24A come into contact with each other. Since the locking protrusions 314K and 24A are provided with the inclined surfaces S1 and S3, when the FL holder 2A is inserted to the lower side, the locking protrusion 24A bends the locking arm 23A without being caught by the locking protrusion 314K. When the FL holder 2A is inserted until the locking protrusion 24A gets over the locking protrusion 314K, the locking arm 23A is restored and the locking protrusion 24A and the locking protrusion 314K are locked.

Figure 6:
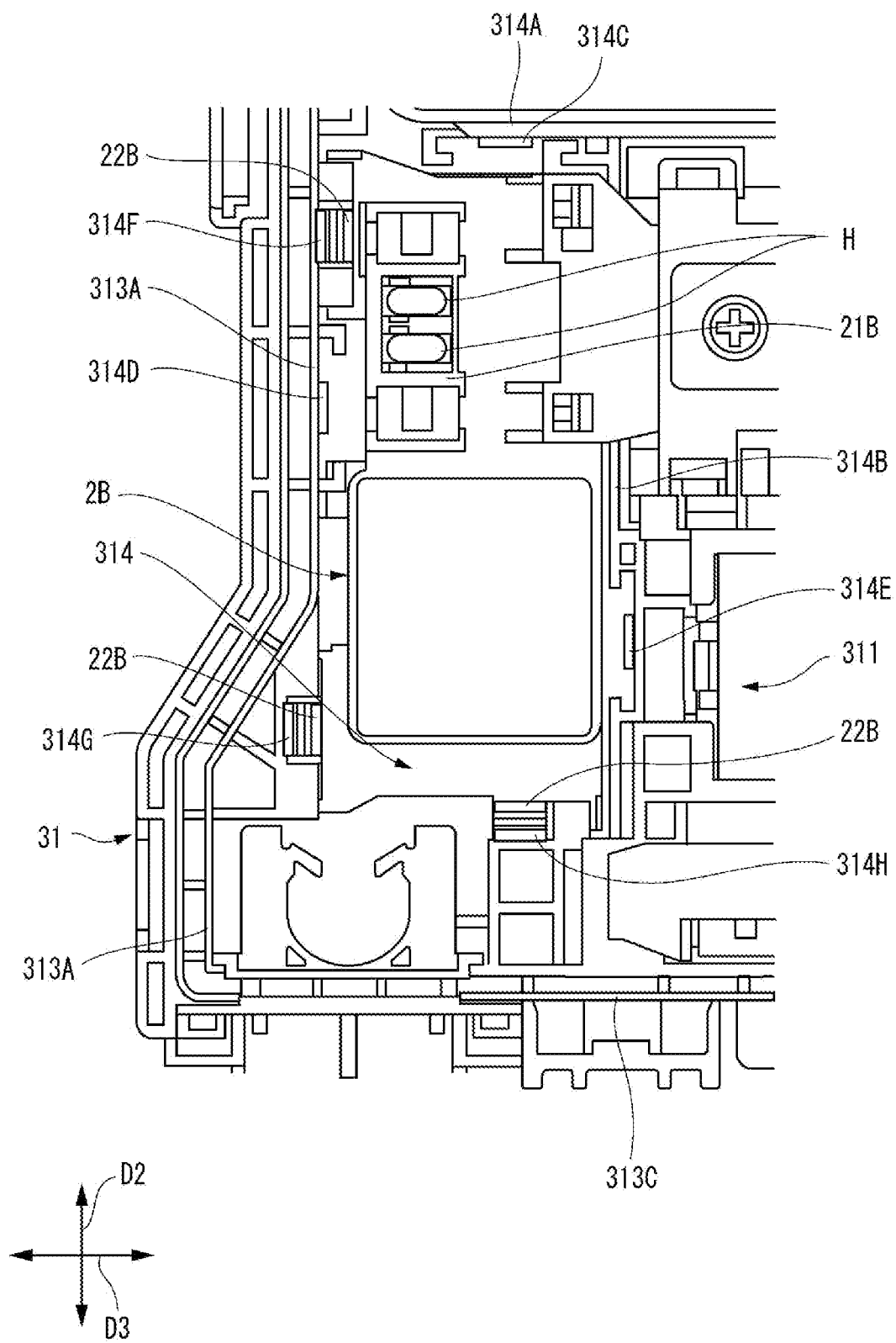
FIG. 6 is a partial top view when an FL holder 2B is accommodated in the frame shown in FIG. 4.

In addition, as shown in FIG. 6, the FL holder 2B is provided with a mounting portion 21BA for mounting the fuse H on the upper side in the up-down direction D1. In addition, the FL holder 2B includes a fourth locking portion 22B configured to be locked to the second locking portions 314F to 314H on the outer surface thereof. As shown in FIG. 8, the fourth locking portion 22B includes a locking protrusion 23B having an inclined surface S4 whose protrusion amount increases toward the lower side in the up-down direction D1.

With the above configuration, when the FL holder 2B is inserted from the lower opening 312 toward the upper opening 311, the locking protrusions 314J and 23B come into contact with each other. Since the locking protrusions 314J and 23B are provided with the inclined surfaces S2 and S4, when the FL holder 2B is inserted toward the upper side, the locking protrusion 23B bends the locking arm 3141 without being caught by the locking protrusion 314J. When the FL holder 2B is inserted until the locking protrusion 23B gets over the locking protrusion 314J, the locking arm 3141 is restored and the locking protrusion 23B and the locking protrusion 314J are locked.

Next, the upper cover 32, the lower cover 33, and the side cover 34 will be described. As shown in FIG. 3 or the like, the upper cover 32 includes a substantially rectangular upper cover main body 321 that covers the upper opening 311, and a peripheral wall 322 that protrudes toward the lower side from a peripheral edge of the upper cover main body 321. The lower cover 33 include a substantially rectangular lower cover main body 331 that covers the lower opening 312, and a peripheral wall 332 that protrudes toward the upper side from a peripheral edge of the lower cover main body 331. The side cover 34 covers a part of a first notch 41 provided at an end portion of the peripheral wall 313C on an upper cover 32 side.

As shown in FIG. 2 and FIG. 3, the first electric wire through hole 4 includes a first notch 41 provided at an end portion of the peripheral wall 313C on the upper cover 32 side and a third notch 42 provided at an end portion of the side cover 34 on a lower cover 33 side. As shown in FIG. 3, the first notch 41b is provided in a long shape in the up-down direction D1 and is provided in a semicircular shape in which a lower end portion is convex toward the lower side. The side cover 34 is provided with a semicircular third notch 42 that is provided in a long rectangular flat plate in the up-down direction D1 so as to cover an upper end portion of the first notch 41, and protrudes toward the upper side at the lower end. When the side cover 34 is attached to the frame 31, a substantially circular first electric wire through hole 4 is formed between the lower end portion of the first notch 41 and the third notch 42.

As shown in FIG. 2 and FIG. 3, the peripheral wall 313C is provided with a U-shaped portion 61 protruding from a peripheral edge of the lower end portion of the first notch 41 to the outside of the case 3. The side cover 34 is provided with a U-shaped portion 62 protruding from a peripheral edge of the third notch 42 to the outside of the case 3. When the side cover 34 is attached to the frame 31, the U-shaped portions 61 and 62 are overlapped in the up-down direction to form a cylindrical first tubular portion 6 protruding outward from a peripheral edge of the first electric wire through hole 4.

With the above configuration, when the upper cover 32 and the side cover 34 are removed from the frame 31, an upper side of the first notch 41 is opened, and the electric wire can be inserted into the first notch 41 through the upper opening of the first notch 41.

As shown in FIG. 2 and FIG. 3, the second electric wire through hole 5 includes a second notch 51 provided at an end portion of the peripheral wall 313C constituting the frame main body 313 on the lower cover 33 side, and a fourth notch 52 provided in the peripheral wall 332 constituting the lower cover 33 on the upper cover 32 side. The second notch 51 is provided in a semicircular shape that is convex toward the upper side. The fourth notch 52 is provided in a semicircular shape that is convex toward the lower side. When the lower cover 33 is attached to the frame 31, a substantially circular second electric wire through hole 5 is formed between the second notch 51 and the fourth notch 52.

The peripheral wall 313C is provided with a U-shaped portion 71 protruding from a peripheral edge of the second notch 51 to the outside of the case 3. The lower cover 33 is provided with a U-shaped portion 72 protruding from a peripheral edge of the fourth notch 52 to the outside of the case 3. When the lower cover 33 is attached to the frame 31, the U-shaped portions 71 and 72 are overlapped in the up-down direction to form a cylindrical second tubular portion 7 protruding outward from a peripheral edge of the second electric wire through hole 5.

With the above configuration, when the lower cover 33 is removed from the frame 31, a lower side of the second notch 51 is opened, and the electric wire can be inserted into the second notch 51 through the lower opening of the second notch 51.

Next, an assembling method of the electric junction box 1 having the above configuration will be described. First, a procedure for accommodating the FL holder 2A in the case 3 will be described. It is assumed that the lower cover 33 is attached to the frame 31, and the upper cover 32 and the side cover 34 are removed. The FL holder 2A is accommodated in the accommodation portion 314 through the upper opening 311, and the third locking portion 22A of the FL holder 2A and the first locking portions 314C to 314E of the accommodation portion 314 are locked to each other. Further, the electric wire connected to the fuse H is arranged by being inserted into the first notch 41 through the upper opening of the first notch 41 (locking step).

Thereafter, the side cover 34 is attached to the frame 31 so as to cover the first notch 41 (third cover attachment step). Accordingly, the first electric wire through hole 4 and the first tubular portion 6 are formed in a state where the electric wire is passed through. Further, the upper cover 32 is attached to the frame 31 (second cover attachment step) and the process is completed.

Next, a procedure for accommodating the FL holder 2B in the case 3 will be described. It is assumed that the lower cover 33 is removed from the frame 31. The lower opening 312 of the frame 31 faces toward the upper side. Thereafter, the FL holder 2B is accommodated in the accommodation portion 314 through the lower opening 312, and the fourth locking portion 22B of the FL holder 2B and the second locking portions 314F to 314H of the accommodation portion 314 are locked to each other. Further, the electric wire connected to the fuse H is arranged by being inserted into the second notch 51 through the lower opening of the second notch 51 (locking step).

Thereafter, the lower cover 33 is attached to the frame 31 (second cover attachment step). Accordingly, the second electric wire through hole 5 is formed in a state where the electric wire is passed through, and the process is completed.

According to the above embodiment, both the first locking portions 314C to 314E, capable of locking the FL holder 2A when the FL holder 2A is inserted from the upper opening 311 toward the lower opening 312, and the second locking portions 314F to 314H, capable of locking the FL holder 2B when the FL holder 2B is inserted from the lower opening 312 toward the upper opening 311, are provided in one accommodation portion 314. Accordingly, the FL holders 2A and 2B can be inserted into the same accommodation portion 314 from both the upper opening 311 and the lower opening 312. It is not necessary to separately provide a frame capable of accommodating the FL holder 2A from the upper opening 311 and a frame capable of accommodating the FL holder 2B from the lower opening 312, and cost reduction can be achieved.

According to the above embodiment, when inserting the FL holder 2A from the upper opening 311, the electric wire is inserted from the end portion of the first notch 41 on the upper cover 32 side, and then the upper cover 32 and the side cover 34 are attached, whereby the electric wire can be inserted into the first electric wire through hole 4 and the electric wire can be pulled out of the case 3. When inserting the FL holder 2B from the lower opening 312, the electric wire is inserted through the opening of the second notch 51 on the lower cover 33 side, and then the lower cover 33 is attached, whereby the electric wire can be inserted into the second electric wire through hole 5 and the electric wire can be pulled out of the case 3.

The present invention is not limited to the above-described embodiments, and can be modified, improved, and the like as appropriate. In addition, the material, shape, dimension, number, arrangement position, or the like of each component in the above embodiment are optional and are not limited as long as the present invention can be achieved.

For example, the electronic component is not limited to the above fuse, but may be a relay or the like to be accommodated in the electric junction box 1.

In addition, the shapes of the first to fourth locking portions 314C to 314E, 314F to 314H, 22A, and 22B are not limited to the above embodiment, and other well-known locking shapes may be used.

Further, according to the above embodiment, the upper cover 32 and the side cover 34 are provided separately, but the present invention is not limited thereto. The upper cover 32 and the side cover 34 may be provided integrally.

Here, characteristics of the embodiment of the electric junction box and the assembling method thereof according to the present invention described above are summarized briefly in the following [1] to [8].

[1] An electric junction box (1) including:
a holding portion (2A or 2B) configured to hold an electronic component (H); and
a case (3) including a tubular frame (31) with a first opening (311) and a second opening (312) at both end portions, a first cover (32) that closes the first opening (311), and a second cover (33) that closes the second opening (312), and configured to accommodate the holding portion (2A, 2B), wherein
the frame (31) includes a tubular frame main body (313) and a tubular accommodation portion (314) for accommodating the holding portion (2A, 2B), which is provided by partitioning an inside of the frame main body (313), and
both first locking portions (314C to 314E), capable of locking the holding portion (2A) when the holding portion (2A) is inserted from the first opening (311) toward the second opening (312), and second locking portions (314F to 314H), capable of locking the holding portion (2B) when the holding portion (2B) is inserted from the second opening (312) toward the first opening (311), are provided in one accommodation portion (314).

[2] The electric junction box (1) according to [1], further including:
a first electric wire through hole (4) formed of a first notch (41) provided at an end portion of the frame main body (313) on a first cover (32) side; and
a second electric wire through hole (5) formed of a second notch (51) provided at an end portion of the frame main body (313) on a second cover (33) side.

[3] The electric junction box (1) according to [2], further including:
a third cover (34) configured to cover the first notch (41), wherein
the first electric wire through hole (4) includes the first notch (41) and a third notch (42) provided at an end portion of the third cover (34) on the second cover (33) side, and the second electric wire through hole (5) includes the second notch (51) and a fourth notch (52) provided at an end portion of the second cover (33) on the first cover (32) side.

[4] The electric junction box (1) according to [2], wherein
the holding portion (2A) includes a third locking portion (22A) configured to be locked to the first locking portions (314C to 314E), and
an electric wire connected to the electronic component (H) held in the holding portion (2A, 2B) is pulled out to an outside of the case (3) through the first electric wire through hole (4).

[5] The electric junction box (1) according to [2], wherein
the holding portion (2B) includes a fourth locking portion (22B) configured to be locked to the second locking portions (314F to 314H), and
an electric wire connected to the electronic component (H) held in the holding portion (2A, 2B) is pulled out to an outside of the case (3) through the second electric wire through hole (5).

[6] An assembling method of the electric junction box (1) according to [4], the assembling method including:
a locking step of accommodating the holding portion (2A) in the accommodation portion (314) through the first opening (311), locking the holding portion (2A) to the accommodation portion (314), and arranging the electric wire connected to the electronic component (H) in the first notch (41); and
a first cover attachment step of attaching the first cover (32) after the locking step.

[7] The assembling method of an electric junction box (1) according to [6], further including:
a third cover attachment step of covering the first notch (41) and attaching the third cover (34) provided with the fourth notch (52) on the second cover (33) side, after the locking step, wherein
the first cover attachment step is performed after the third cover attachment step.

[8] An assembling method of the electric junction box (1) according to [6], the assembling method including:
a locking step of accommodating the holding portion (2B) in the accommodation portion (314) through the second opening (312), locking the holding portion (2B) to the accommodation portion (314), and arranging the electric wire connected to the electronic component (H) in the second notch (51); and
a second cover attachment step of attaching the second cover (33) after the locking step.

According to the electric junction box having the configuration of the [1] above, both the first locking portions, capable of locking the holding portion when the holding portion is inserted from the first opening toward the second opening, and second locking portions, capable of locking the holding portion when the holding portion is inserted from the second opening toward the first opening, are provided in one accommodation portion. Accordingly, the holding portions can be inserted into the same accommodation portion from the first opening and the second opening. It is not necessary to separately provide a frame capable of accommodating the holding portion from the first opening and a frame capable of accommodating the holding portion from the second opening, and cost reduction can be achieved.

According to the electric junction box having the configurations of the [2] and [3] above, when inserting the holding portion through the first opening, the electric wire is inserted from the end portion of the first notch on the first cover side, and then the first cover and the third cover (if any) are attached, whereby the electric wire can be inserted into the first electric wire through hole and the electric wire can be pulled out of the case. When inserting the holding portion through the second opening, the electric wire is inserted through the opening of the second notch on the second cover side, and then the second cover is attached, whereby the electric wire can be inserted into the second electric wire through hole and the electric wire can be pulled out of the case.

According to the electric junction box and the assembling method thereof having the configurations of the [4], [6], and [7] above, when inserting the holding portion through the first opening in a state where the first cover and the third cover are not attached, the electric wire is inserted from the end portion of the first notch on the first cover side, and then the third cover is attached, whereby the electric wire can be inserted into the first electric wire through hole.

According to the electric junction box and the assembling method thereof having the configurations of the [5] and [8] above, when inserting the holding portion through the second opening a state where the second cover is not attached, the electric wire is inserted from the opening of the third notch on the second cover side, and then the third cover is attached, whereby the electric wire can be inserted into the second electric wire through hole and the electric wire can be pulled out of the case.

According to the present invention, it is possible to provide an electric junction box and an assembling method thereof, in which the holding portions can be inserted into the same accommodation portion from the first opening and the second opening and which achieve cost reduction.

What is claimed is:

1. An assembly structure of an electric junction box comprising:
    a holding portion that is configured to hold an electronic component; and
    a case that is configured to accommodate the holding portion and includes a tubular frame with a first opening and a second opening at both end portions, a first cover that closes the first opening, and a second cover that closes the second opening,
    wherein as the holding portion, two types of a first holding portion having a third locking portion and a second holding portion having a fourth locking portion are provided,
    wherein the frame includes a tubular frame main body and a tubular accommodation portion for accommodating the holding portion, which is provided by partitioning an inside of the frame main body,
    one of the first holding portion and the second holding portion is accommodating in one accommodation portion,
    both a first locking portion and a second locking portion are provided in the one accommodation portion,
    the first locking portion is configured to be able to lock the third locking portion of the first holding portion when the first holding portion is inserted from the first opening toward the second opening,
    the second locking portion is configured to be able to lock the fourth locking portion of the second holding portion when the second holding portion is inserted from the second opening toward the first opening,
    each of the first locking portion and the fourth locking portion includes a locking protrusion, and
    each of the second locking potion and the third locking portion includes a locking arm protruding toward the first cover and having flexibility.

2. The assembly structure of the electric junction box according to claim 1, further comprising:
    a first electric wire through hole formed of a first notch provided at a first end portion of the frame main body on a first cover side; and
    a second electric wire through hole formed of a second notch provided at a second end portion of the frame main body on a second cover side.

3. The assembly structure of the electric junction box according to claim 2, further comprising:
    a third cover that is configured to cover the first notch,
    wherein the first electric wire through hole includes the first notch and a third notch provided at an end portion of the third cover on the second cover side, and
    the second electric wire through hole includes the second notch and a fourth notch provided at an end portion of the second cover on the first cover side.

4. An assembling method of the electric junction box according to claim 3, the assembling method comprising:
    a locking step of accommodating the first holding portion in the accommodation portion through the first opening, locking the first holding portion to the accommodation portion, and arranging the electric wire connected to the electronic component in the first notch; and
    a first cover attachment step of attaching the first cover after the locking step.

5. The assembling method of an electric junction box according to claim 4, further comprising:
    a third cover attachment step of covering the first notch and attaching the third cover provided with the third notch on the second cover side, after the locking step,
    wherein the first cover attachment step is performed after the third cover attachment step.

6. An assembling method of the electric junction box according to claim 4, the assembling method comprising:
    a locking step of accommodating the second holding portion in the accommodation portion through the second opening, locking the second holding portion to the accommodation portion, and arranging the electric wire connected to the electronic component in the second notch; and
    a second cover attachment step of attaching the second cover after the locking step.

* * * * *